United States Patent
Heng et al.

(10) Patent No.: US 8,686,283 B2
(45) Date of Patent: *Apr. 1, 2014

(54) SOLAR CELL WITH OXIDE TUNNELING JUNCTIONS

(75) Inventors: Jiunn Benjamin Heng, San Jose, CA (US); Chentao Yu, Sunnyvale, CA (US); Zheng Xu, Pleasanton, CA (US); Jianming Fu, Palo Alto, CA (US)

(73) Assignee: Silevo, Inc., Fremont, CA (US)

( * ) Notice: Subject to any disclaimer, the term of this patent is extended or adjusted under 35 U.S.C. 154(b) by 566 days.

This patent is subject to a terminal disclaimer.

(21) Appl. No.: 12/945,792

(22) Filed: Nov. 12, 2010

(65) Prior Publication Data

US 2011/0272012 A1 Nov. 10, 2011

Related U.S. Application Data

(60) Provisional application No. 61/331,158, filed on May 4, 2010.

(51) Int. Cl.
*H01L 31/00* (2006.01)

(52) U.S. Cl.
USPC .......................................... 136/261; 136/255

(58) Field of Classification Search
USPC ....................................................... 136/261
See application file for complete search history.

(56) References Cited

U.S. PATENT DOCUMENTS

| | | | | | |
|---|---|---|---|---|---|
| 5,131,933 A | * | 7/1992 | Flodl et al. | | 136/256 |
| 5,563,092 A | * | 10/1996 | Ohmi | | 438/485 |
| 5,935,345 A | * | 8/1999 | Kuznicki | | 136/255 |
| 2003/0042516 A1 | * | 3/2003 | Forbes et al. | | 257/288 |
| 2004/0123897 A1 | * | 7/2004 | Ojima et al. | | 136/256 |
| 2006/0283499 A1 | * | 12/2006 | Terakawa et al. | | 136/258 |
| 2008/0156370 A1 | * | 7/2008 | Abdallah et al. | | 136/258 |
| 2008/0230122 A1 | * | 9/2008 | Terakawa | | 136/261 |

OTHER PUBLICATIONS

Green, Martin A. et al., "High-Efficiency Silicon Solar Cells," IEEE Transactions on Electron Devices, vol. ED-31, No. 5, May 1984, pp. 679-683.
Davies, P.C.W., "Quantum tunneling time," Am. J. Phys. 73, Jan. 2005, pp. 23-27.
Chabal, Yves J. et al., "Silicon Surface and Interface Issues for Nanoelectronics," The Electrochemical Society Interface, Spring 2005, pp. 31-33.
Roedern, B. von, et al., "Why is the Open-Circuit Voltage of Crystalline Si Solar Cells so Critically Dependent on Emitter-and Base-Doping?" Presented at the 9th Workshop on Crystalline Silicon Solar Cell Materials and Processes, Breckenridge, CO, Aug. 9-11, 1999.

* cited by examiner

*Primary Examiner* — Miriam Berdichevsky
(74) *Attorney, Agent, or Firm* — Shun Yao; Park, Vaughan, Fleming & Dowler LLP

(57) ABSTRACT

One embodiment of the present invention provides a tunneling junction based solar cell. The solar cell includes a base layer; a quantum-tunneling-barrier (QTB) layer situated adjacent to the base layer; an emitter; a surface field layer; a front-side electrode; and a back-side electrode.

37 Claims, 7 Drawing Sheets

SOLAR CELL WITH OXIDE TUNNELING JUNCTIONS

RELATED APPLICATION

This application claims the benefit of U.S. Provisional Application No. 61/331,158, entitled "Solar Cell with Hetero Tunneling Junction (HTJ)," by inventors Jiunn Benjamin Heng, Chentao Yu, Zheng Xu, and Jianming Fu, filed 4 May 2010.

BACKGROUND

1. Field

This disclosure is generally related to solar cells. More specifically, this disclosure is related to a solar cell based on a tunneling junction structure that uses a dielectric material (e.g. silicon oxide) to form a tunneling layer.

2. Related Art

The negative environmental impact caused by the use of fossil fuels and their rising cost have resulted in a dire need for cleaner, cheaper alternative energy sources. Among different forms of alternative energy sources, solar power has been favored for its cleanness and wide availability.

A solar cell converts light into electricity using the photoelectric effect. There are many solar cell structures and a typical solar cell contains a p-n junction that includes a p-type doped layer and an n-type doped layer. In addition, there are other types of solar cells that are not based on p-n junctions. For example, a solar cell can be based on a metal-insulator-semiconductor (MIS) structure that includes an ultra-thin dielectric or insulating interfacial tunneling layer situated between a metal or a highly conductive layer and a doped semiconductor layer.

In a p-n junction based solar cell, the absorbed light generates carriers. These carriers diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit.

To increase the conversion efficiency, a solar cell structure should allow the photon-generated carriers to effectively transport to the electrode. One of the important paths for carrier loss is the recombination of minority carriers at the cell surfaces. Hence, excellent surface passivation is important for solar cell performance because it directly impacts the open circuit voltage ($V_{oc}$). Note that a good $V_{oc}$ implies a good temperature coefficient, which enables a better solar cell performance at higher temperatures. For homojunction solar cells, minority-carrier recombination at the solar cell surfaces due to the existence of dangling bonds can significantly degrade the surface passivation. In addition, the relatively thick, heavily doped emitter layer, which is formed by dopant diffusion, typically results in worse minority-carrier recombination as well as drastically reduces short-wavelength response. Heterojunction solar cells, such as Si heterojunction (SHJ) solar cells tend to have better surface passivation due to an inherent bandgap offset between an amorphous-Si (a-Si) layer and a crystalline-Si (c-Si) base layer, which reduces the surface recombination velocity by creating a barrier for majority carriers. The a-Si layer also passivates the surface of the c-Si base layer by repairing the existing Si dangling bonds through hydrogenation. However, the a-Si layer that usually forms the emitter is heavily doped, thus resulting in degraded surface passivation and reduced short-wavelength response. To mitigate the increased minority-carrier surface recombination, an intrinsic a-Si layer can be inserted between the heavy doped a-Si layer and the c-Si base layer.

In MIS-based solar cells, an insulating layer, such as silicon oxide with a certain fixed interface charge, is inserted between a metal layer and a semiconductor layer (such as a doped c-Si layer) and induces an inversion layer in the doped c-Si. The built-in surface field at the interface between the inversion layer and the c-Si allows charges to be separated and collected as the minority carriers travels through the highly conductive space-charge region by tunneling through the ultra thin insulating (or oxide) layer. Extremely low surface recombination velocity can be achieved via the surface passivation of the inversion layer and the low defect density states of the inversion "emitter" layer. To avoid introducing high series resistance associated with carrier tunneling through a thick dielectric layer, the tunnel oxide layer needs to be less than 20 or 30 angstroms.

FIG. 1A presents a diagram illustrating an exemplary metal-insulator-semiconductor (MIS) solar cell (prior art). MIS solar cell 100 includes a silicon substrate layer 102 doped with one type of dopant, a thin insulating layer 104, a top metal grid 106, and a bottom metal contact layer 108. Arrows in FIG. 1A indicates incident sunlight.

Although it is possible to achieve good efficiency with MIS-based solar cells on a small scale, it is difficult to scale up the MIS-base solar cells to manufacturable sizes because the poor conductivity of the inversion layer requires a dense metal grid for current collection. In addition, the Cesium (Cs) doped in the oxide layer, which is introduced to induce the inversion layer, is not stable.

On the other hand, all ultra-high-efficiency mono-crystalline Si-based solar cell structures are specifically designed to enable high $V_{oc}$ through excellent surface passivation. The current record holder of solar cell efficiency is a solar cell based on an interdigited back-contact (IBC) structure as described in U.S. Pat. No. 4,927,770. In the IBC-based solar cell, good $V_{oc}$ is achieved with a front- and back-surface oxide passivation as well as a rear interdigited emitter and base point contacts. A further improvement made for the IBC structure is shown in U.S. Pat. No. 7,737,357, where the rear interdigited emitter and base contacts are replaced with doped a-Si contacts formed on a tunnel $SiO_2$ layer. This approach results in superior surface passivation provided by the tunnel oxide and the a-Si induced heterojunction field, which led to a $V_{oc}$ greater than 700 mV.

U.S. Pat. No. 5,705,828 discloses a double-sided heterojunction solar cell, which is also a high-efficiency solar cell based on excellent surface passivation. A double-sided heterojunction solar cell can achieve high efficiency with higher open circuit voltage ($V_{oc}$), such as greater than 715 mV, by implementing a high-quality intrinsic a-Si interface layer. The intrinsic a-Si layer reduces the number of surface dangling bonds and provides an inherent heterojunction bandgap offset, which creates a favorable heterojunction field for reducing leakage current.

Other approaches to obtain high-efficiency solar cells by improving surface passivation have been proposed. U.S. Pat. No. 7,164,150 further describes a method for suppressing carrier recombination at the interface between the c-Si base layer and the intrinsic a-Si layer by introducing carbon dioxide ($CO_2$) gas during the deposition of the intrinsic a-Si. $V_{oc}$ of the solar cell can be increased by tuning the processing condition during the a-Si deposition. U.S. Pat. No. 4,404,422 describes a MIS-based solar cell that implements an ultra-thin tunneling oxide layer to enable very low interface density states without increasing the series resistance associated with tunneling through the dielectric layer. Different variations of the MIS-based solar cell structures are described in U.S. Pat. Nos. 4,828,628 and 4,343,962. These solar cells gain good performance by inducing an inversion layer in the c-Si base. The use of the oxide layer and the inversion-induced emitter lead to the surface passivation and the reduction of surface defect states, respectively. The combination of these effects results in an excellent minority-carrier recombination velocity.

However, further improvement is still needed to obtain solar cells with even better performance as well as the potential to achieve solar cells with efficiency greater than 23%. An even higher $V_{oc}$ (higher than 750 mV) is a crucial condition for an ultra-high performance solar cell with an extremely low temperature coefficient (less than 0.25%/° C.). To accomplish such a high $V_{oc}$, it is desirable to obtain a very low defect-interface-state density ($D_{it}$), such as less than $1 \times 10^{11}/cm^2$.

SUMMARY

One embodiment of the present invention provides a tunneling-junction based solar cell. The solar cell includes a base layer; a quantum-tunneling-barrier (QTB) layer situated adjacent to the base layer; an emitter; a surface field layer; a front-side electrode; and a back-side electrode.

In a variation on the embodiment, the base layer includes at least one of: a mono-crystalline silicon wafer, and an epitaxially grown crystalline-Si (c-Si) thin film.

In a further variation, the epitaxially grown c-Si thin film's doping profile is modulated.

In a variation on the embodiment, the base layer includes a thin layer of intrinsic Si situated substantially in the middle of the film, and the intrinsic Si layer's thickness is between 1 nm and 10 nm.

In a variation on the embodiment, the QTB layer includes at least one of: silicon oxide ($SiO_x$), hydrogenated $SiO_x$, silicon nitride ($SiN_x$), hydrogenated $SiN_x$, aluminum oxide ($AlO_x$), silicon oxynitride (SiON), and hydrogenated SiON.

In a variation on the embodiment, the QTB layer has a thickness between 1 and 50 angstroms.

In a variation on the embodiment, the QTB layer is formed using at least one of the following techniques: thermal oxidation, atomic layer deposition, wet or steam oxidation, low-pressure radical oxidation, and plasma-enhanced chemical-vapor deposition (PECVD).

In a variation on the embodiment, the solar cell further includes a transparent conductive oxide (TCO) layer situated on top of the emitter, the surface field layer, or both.

In a variation on the embodiment, the emitter and/or the surface field layer include amorphous-Si (a-Si).

In a further variation, the emitter includes carbon-doped a-Si.

In a further variation, the emitter and/or the surface field layer comprise undoped a-Si.

In a further variation, the emitter and/or the surface field layer comprise graded-doped amorphous-Si (a-Si).

In a further variation, the graded-doped a-Si has a doping concentration ranging between $1 \times 10^{15}/cm^3$ and $5 \times 10^{20}/cm^3$.

In a further variation, an n-type dopant used for the graded-doped a-Si includes phosphorous, and a p-type dopant used for the graded-doped a-Si includes boron.

In a variation on the embodiment, the base layer has a donor (n-type) or acceptor (p-type) doping concentration ranging between $1 \times 10^{14}/cm^3$ and $1 \times 10^{18}/cm^3$.

In a further variation, the emitter has an opposite doping type as that of the base layer, and the surface field layer has a same doping type as that of the base layer.

In a further variation, the emitter is situated above the base layer, facing incident light, and the surface field layer is situated beneath the base layer to act as a back surface field (BSF).

In a further variation, the emitter is situated beneath the base layer, facing away from incident light, and the surface field layer is situated above the base layer to act as a front surface field (FSF).

BRIEF DESCRIPTION OF THE FIGURES

In the figures, like reference numerals refer to the same figure elements.

DETAILED DESCRIPTION

Figure 1A:
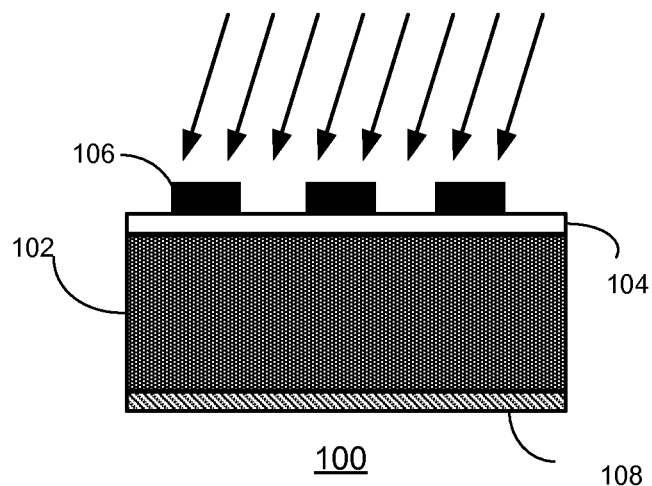
FIG. 1A presents a diagram illustrating an exemplary metal-insulator-semiconductor (MIS) solar cell (prior art).

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a crystalline-Si (c-Si) solar cell that includes a thin dielectric layer functioning as an interface passivation layer as well as a quantum-tunneling barrier (QTB). The solar cell can be fabricated by deposition of a high-quality ultra-thin silicon oxide ($SiO_x$) layer on the front and back surfaces of the c-Si base layer to provide passivation and enables quantum tunneling of carriers. In addition, a graded-doping amorphous-Si (a-Si) layer is deposited on the front and back oxide layers to form the solar cell emitter as well as the back surface field (BSF). The a-Si layers allow further passivation via field effect passivation and energy band bending. The resulting tunneling junction solar cell can achieve ultra-high open circuit voltage ($V_{oc}$) without compromising the carrier collection efficiency thus leading to excellent cell conversion efficiency and temperature coefficient performance. In addition, the thin oxide layers allow a wider range of doping modulations of the a-Si layers, which can serve as a better dopant diffusion barrier for maintaining good c-Si interface quality.

Oxide Tunneling Junction

In embodiments of the present invention, a thin layer of dielectric material, such as $SiO_x$, is used as a quantum tunneling barrier (QTB) between the solar cell base layer and the emitter layer. Quantum mechanics predicts that a particle has a finite probability of appearing on the other side of any physical barrier, even when the barrier has a potential energy that is greater than the kinetic energy of the particle. If the barrier is thin enough, the probability of the particle reaching the other side of the barrier can be non-negligible. Such a phenomenon is referred to as quantum tunneling. For an electron encountering a square potential barrier of height $\Delta E$ and width d, the probability of the electron reaching the other side of the barrier is approximately:

$$P = \exp\left(-\frac{2d\sqrt{2m_e \Delta E}}{\hbar}\right),$$

where $m_e$ is the mass of the electron (=5.7×10$^{-12}$ eV·s$^2$/m$^2$), and $\hbar$ is the Planck's constant (=6.6×10$^{-16}$ eV·s). If the barrier is a thin layer of $SiO_x$, then $\Delta E$=3.15 eV.

For solar cell applications, the electrons do not need to tunnel all the way to the other side of the oxide layer. In fact, as long as the electron can tunnel into the conduction band of the oxide layer, under a large enough electric field (in this case, a large built-in field), the electron will be able to tunnel across the oxide layer through a triangular barrier. Such tunneling is known the Fowler-Nordheim tunneling. Based on the WKB approximation, the probability of an electron tunneling through a potential barrier having potential energy V(x) is:

$$P = \exp\left(\int_a^b -\frac{2\sqrt{2m_e}}{\hbar}\sqrt{V(x)-E} \cdot dx\right),$$

where E is the starting energy of the electron, a is the starting position of the barrier, and b is the ending position of the barrier. Assuming that the electron starts at the c-Si conduction band with an energy of 1.33 eV (note that the photon energy of green light is 2.33 eV), and the triangular barrier has a height of 3.15 eV with a conduction band offset of 0.2 eV, the resulting probability can be relatively high for the electron to tunnel through a thin layer of $SiO_x$.

Silicon monoxide (SiO), which has an absolute barrier height between 0.85 and 0.95 eV, has been proven to allow better tunneling of carriers. The probability for an electron to tunnel through a triangular barrier of 0.85 eV with a conduction band offset of 0.2 eV (which is due to the existence of the a-Si heterojunction) can reach between 0.4 and 0.6 even for electrons with a low starting energy of 0.3 eV.

In addition to an oxide tunneling junction at the front side between the base layer and the emitter, in some embodiments of the present invention, a back-side oxide tunneling junction is also introduced between the base layer and the back surface field (BSF) to achieve a similar effect for improving $V_{oc}$.

In embodiments of the present invention, an ultra-high performance solar cell is provided, which entails a double-sided MIS tunneling structure with doped front and back a-Si layers serving as emitter and BSF, respectively. The insulating (oxide) layers function as passivation layers and tunneling barriers. The front a-Si layer replaces the Cs doping in the original MIS structure to achieve the band-bending effect in the emitter. The combination of a thin oxide passivation layer and a heterojunction field enables an extremely high $V_{oc}$ while maintaining a low series resistance for tunneling through the ultra thin oxide layer.

Figure 1B:
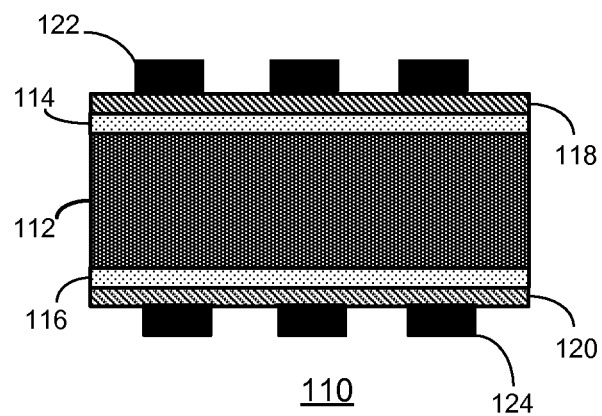
FIG. 1B presents a diagram illustrating an exemplary tunneling junction solar cell in accordance with an embodiment of the present invention

FIG. 1B presents a diagram illustrating an exemplary tunneling junction solar cell in accordance with an embodiment of the present invention. Oxide tunneling junction solar cell 110 includes an n-type substrate 112, ultra-thin silicon oxide layers 114 and 116 covering the surfaces of substrate 112 and passivating the surface-defect states, a front-side doped a-Si layer forming an emitter 118, a back-side doped a-Si layer forming a BSF layer 120, a front electrode 122, and a back electrode 124.

Figure 1C:
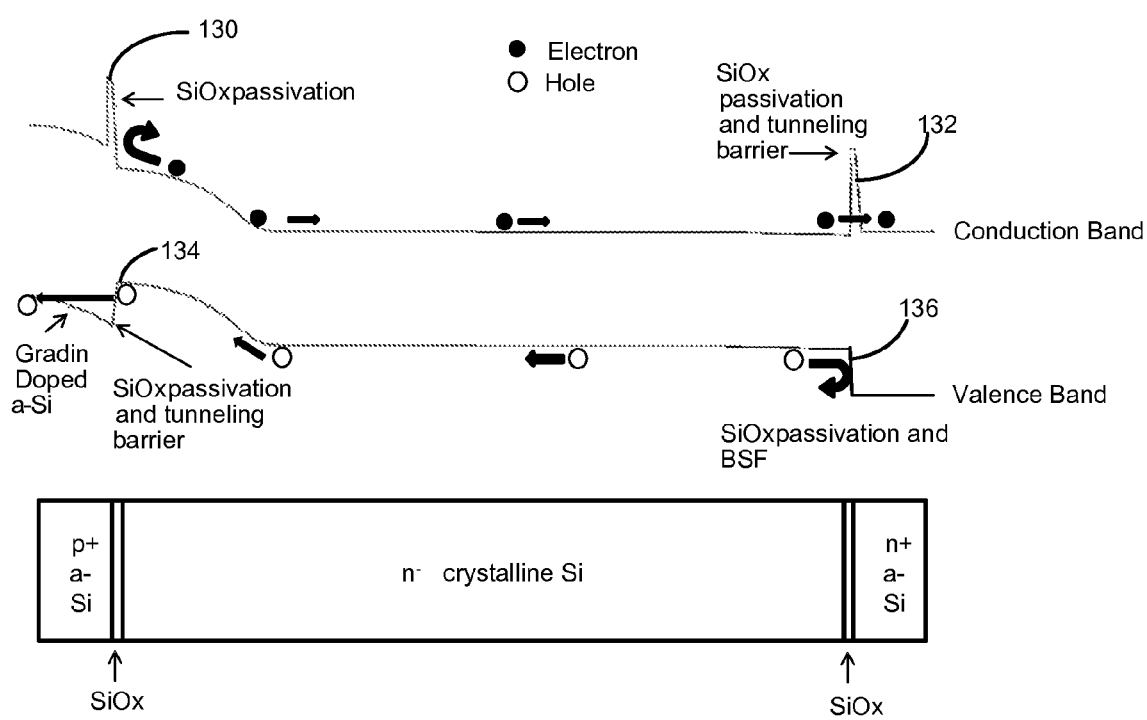
FIG. 1C presents a diagram illustrating the energy band diagram of the tunneling junction solar cell shown in FIG. 1B, in accordance with an embodiment of the present invention

FIG. 1C presents a diagram illustrating the energy band diagram of the tunneling junction solar cell shown in FIG. 1B, in accordance with an embodiment of the present invention. From FIGS. 1B and 1C, one can see that emitter 118 and BSF layer 120 passivate the surfaces of solar cell 110 using a built-in heterojunction field. Front-side a-Si emitter 118 forms a junction, which allows charges to be separated, with the c-Si substrate 112. The minority carriers (holes shown in FIG. 1C) tunnel through the front ultra-thin oxide layer 114 (which generates front tunneling barrier 134) to reach a-Si emitter 116 and are collected by front conducting electrode 122. In one embodiment the minority carriers are holes, thus resulting in a lower junction recombination current due to a smaller capture cross-section. The majority carriers (electrons shown in FIG. 1C) are prevent from diffusing into the junction by a front surface field (FSF) 130, thus reducing the recombination current or junction leakage current. The back-side a-Si BSF layer 120 generates BSF 136 that prevents the minority carriers from recombination at the back surface while allowing the majority carriers to be collected by back conductive electrode 124 via tunneling through the back-side ultra thin oxide layer 116, which generates back tunneling barrier 132.

Fabrication Method I

Figure 2:
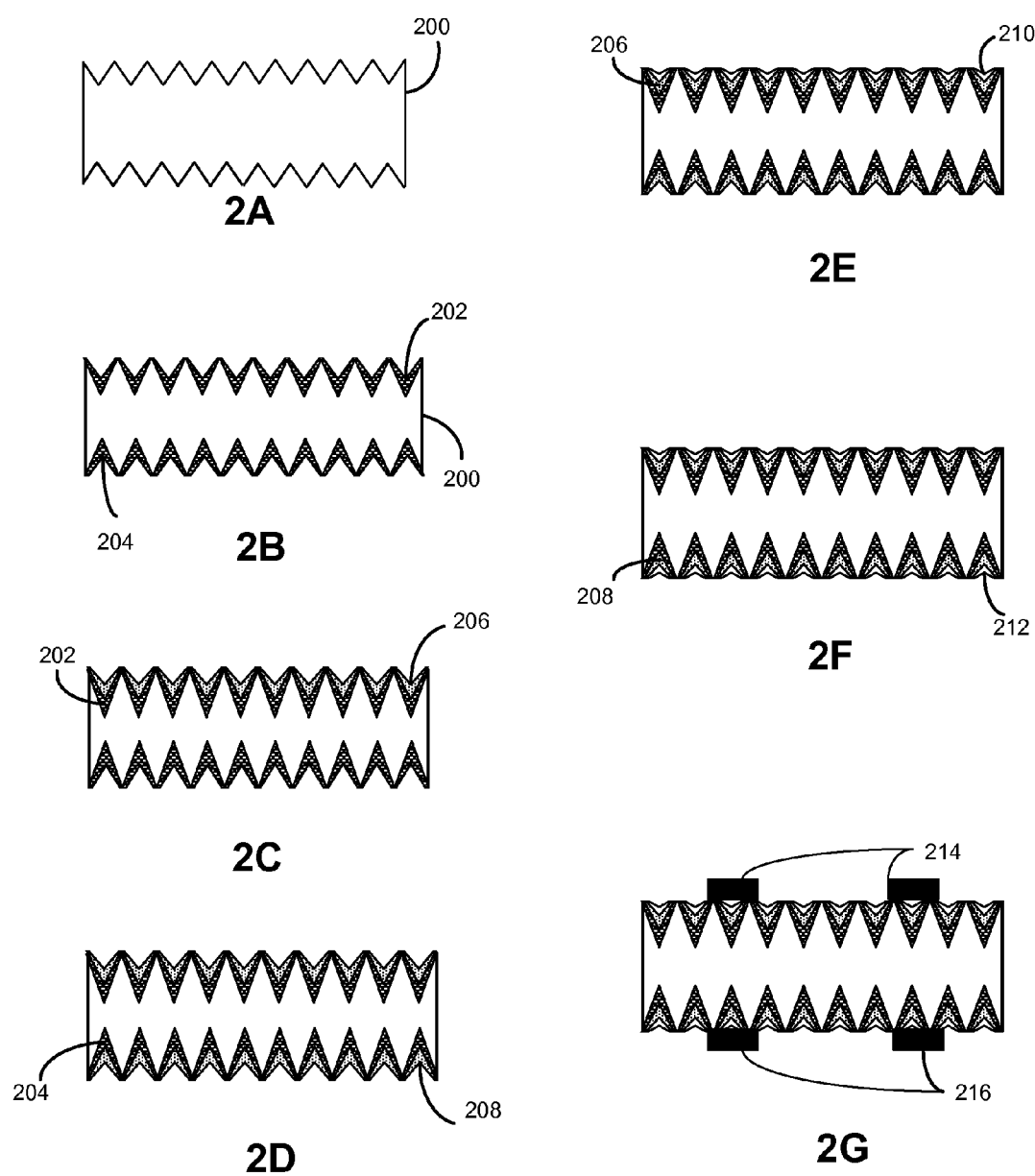
FIG. 2 presents a diagram illustrating the process of fabricating a tunneling junction solar cell in accordance with an embodiment of the present invention.

Either n- or p-type doped high-quality solar-grade silicon (SG-Si) wafers can be used to build the oxide tunneling junction solar cell. In one embodiment, an n-type doped SG-Si wafer is selected. FIG. 2 presents a diagram illustrating the process of fabricating a tunneling junction solar cell in accordance with an embodiment of the present invention.

In operation 2A, an SG-Si substrate 200 is prepared. The resistivity of the SG-Si substrate is typically in, but not limited to, the range between 0.50 Ohm-cm and 10 Ohm-cm. It is preferable to have an SG-Si substrate with resistivity between 0.50 Ohm-cm and 10 Ohm-cm. The preparation operation includes typical saw damage etching that removes approximately 10 μm of silicon and surface texturing. The surface texture can have various patterns, including but not limited to: hexagonal-pyramid, inverted pyramid, cylinder, cone, ring, and other irregular shapes. In one embodiment, the surface texturing operation results in a random pyramid textured surface. Afterwards, the SG-Si substrate goes through extensive surface cleaning.

In operation 2B, a thin layer of high-quality (with $D_{it}$ less than 1×10$^{11}$/cm$^2$) dielectric material is deposited on the front and back surfaces of SG-Si substrate 200 to form the front and back passivation/tunneling layers 202 and 204, respectively. In one embodiment, only the front surface of SG-Si substrate 200 is deposited with a thin layer of dielectric material. In an alternative embodiment, only the back surface of SG-Si substrate 200 is deposited with a thin layer of dielectric material. Various types of dielectric materials can be used to form the passivation/tunneling layers, including, but not limited to: silicon oxide ($SiO_x$), hydrogenated $SiO_x$, silicon nitride ($SiN_x$), hydrogenated $SiN_x$, aluminum oxide ($AlO_x$), silicon oxynitride (SiON), aluminum oxide ($AlO_x$), and hydrogenated SiON. In addition, various deposition techniques can be used to deposit the passivation/tunneling layers, including, but not limited to: thermal oxidation, atomic layer deposition, wet or steam oxidation, low-pressure radical oxidation, plasma-enhanced chemical-vapor deposition (PECVD), etc. The thickness of the tunneling/passivation layer can be between 1 and 50 angstroms, preferably between 1 and 10 angstroms. Note that the well-controlled thickness of the tunneling/passivation layer ensures good tunneling and passivation effects.

In operation 2C, a layer of hydrogenated, graded-doping a-Si is deposited on front passivation/tunneling layer 202 to form emitter layer 206. As a result, emitter layer 206 is situated on the front side of the solar cell facing the incident sun light. The doping type of emitter layer 206 is opposite from that of SG-Si substrate 200. If SG-Si substrate 200 is n-type doped, then emitter layer 206 is p-type doped, and vice versa. In one embodiment, emitter layer 206 is p-type doped using boron as dopant. SG-Si substrate 200, front passivation/tunneling layer 202, and emitter layer 206 form the front oxide tunneling junction. The thickness of emitter layer 206 is between 2 and 50 nm. Note that the doping profile of emitter layer 206 can be optimized to ensure good ohmic contact, minimum light absorption, and a large built-in electrical field. In one embodiment, the doping concentration of emitter layer 206 varies from $1\times10^{15}/cm^3$ to $5\times10^{20}/cm^3$. In a further embodiment, the region within emitter layer 206 that is adjacent to front passivation/tunneling layer 202 has a lower doping concentration, and the region that is away from front passivation/tunneling layer 202 has a higher doping concentration. The lower doping concentration ensures minimum defect density at the interface between front passivation/tunneling layer 202 and emitter layer 206, and the higher concentration on the other side prevents emitter layer depletion. The crystal structure of emitter layer 206 can either be nanocrystalline, which enables higher carrier mobility, or protocrystalline, which enables good absorption in the ultra-violet (UV) wavelength range and good transmission in the infrared (IR) wavelength range. Both crystalline structures need to preserve the large bandgap of the a-Si. In one embodiment, emitter layer 206 can include carbon-doped a-Si.

In operation 2D, a layer of hydrogenated, graded-doping a-Si is deposited on the surface of back passivation/tunneling layers 204 to form back surface field (BSF) layer 208. The doping type of BSF layer 208 is the same as that of SG-Si substrate 200. If SG-Si substrate 200 is n-type doped, then emitter layer 206 is also n-type doped, and vise versa. In one embodiment, BSF layer 208 is n-type doped using phosphorous as dopant. SG-Si substrate 200, back passivation/tunneling layer 204, and BSF layer 208 form the back oxide tunneling junction. In one embodiment, the thickness of BSF layer 208 is between 3 and 30 nm. The existence of BSF layer 208 improves the back-side passivation and allows good ohmic contact to a subsequently deposited back transparent conductive oxide (TCO) layer. Similar to emitter layer 206, the region within BSF layer 208 that is adjacent to back passivation/tunneling layer 204 has a lower doping concentration, and the region that is away from back passivation/tunneling layer 204 has a higher doping concentration. The lower doping concentration ensures minimum defect density at the interface between back passivation/tunneling layer 204 and BSF layer 208, and the higher concentration on the other side ensures good ohmic-contact to the back TCO layer. In one embodiment, the doping concentration of BSF layer 208 varies from $1\times10^{15}/cm^3$ to $5\times10^{20}/cm^3$. In addition to a-Si, it is also possible to use other material to form BSF layer 208. In one embodiment, a layer of micro-crystalline Si is deposited on the surface of back passivation/tunneling layer 204 to form BSF layer 208. Using micro-crystalline Si material for BSF layer 208 can ensure lower series resistance and better ohmic contact with the back TCO layer.

In operation 2E, a layer of TCO material is deposited on the surface of emitter layer 206 to form a conductive anti-reflection layer 210. Examples of TCO include, but are not limited to: indium-tin-oxide (ITO), tin-oxide ($SnO_x$), aluminum doped zinc-oxide (ZnO:Al or AZO), or gallium doped zinc-oxide (ZnO:Ga).

In operation 2F, back-side TCO layer 212 is formed on the surface of BSF layer 208.

In operation 2G, front-side electrode 214 and back-side electrode 216 are formed on the surfaces of TCO layers 210 and 212, respectively. In one embodiment, front-side electrode 214 and back-side electrode 216 include Ag finger grids, which can be formed using various techniques, including, but not limited to: screen printing of Ag paste, inkjet or aerosol printing of Ag ink, and evaporation. In a further embodiment, front-side electrode 214 and back-side electrode 216 can include Cu grid formed using various techniques, including, but not limited to: electroless plating, electro plating, sputtering, and evaporation.

Fabrication Method II

Figure 3:
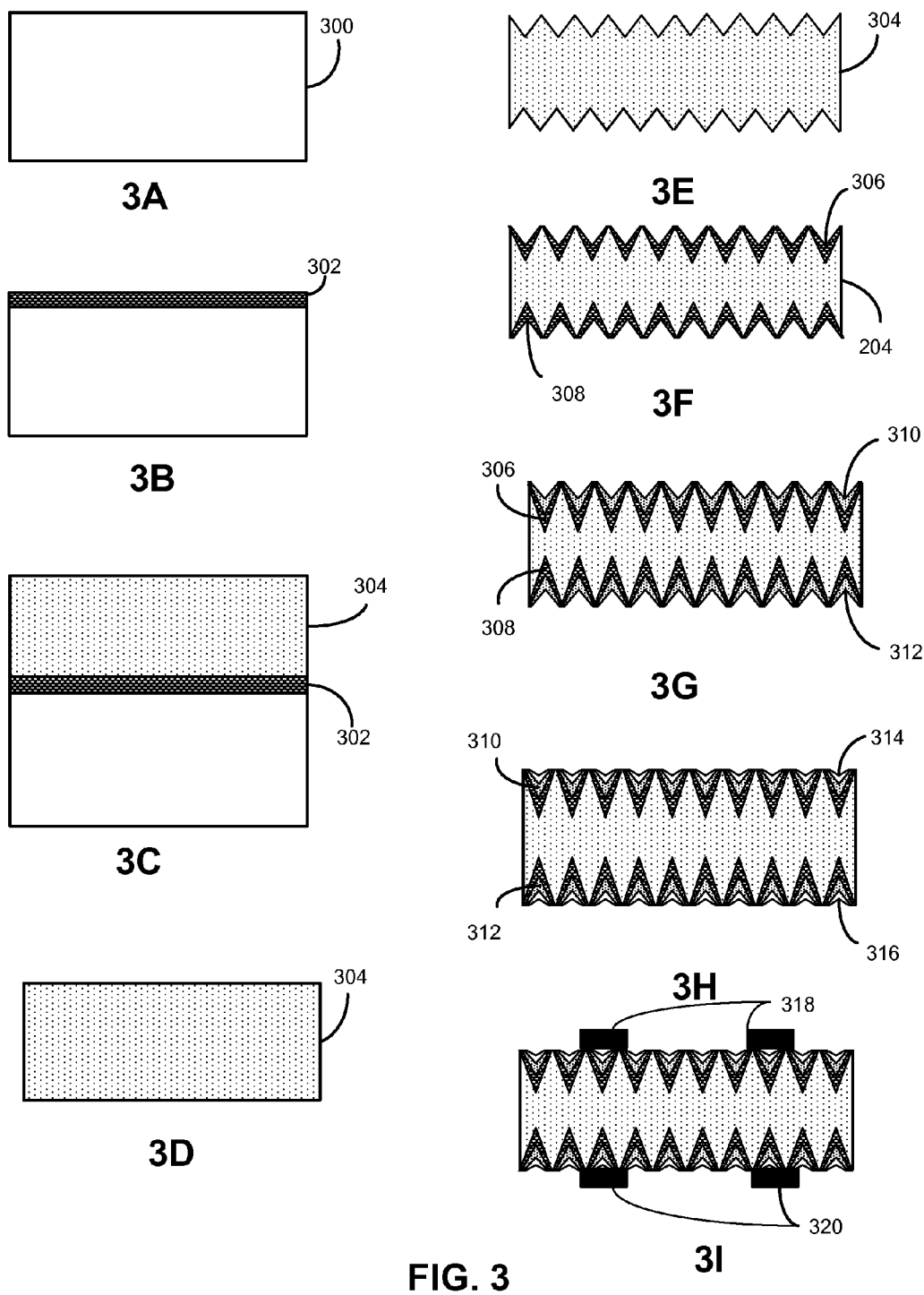
FIG. 3 presents a diagram illustrating the process of fabricating a tunneling junction solar cell in accordance with an embodiment of the present invention.

FIG. 3 presents a diagram illustrating the process of fabricating a tunneling junction solar cell in accordance with an embodiment of the present invention. The fabrication process is similar to the one shown in FIG. 2 except that, instead of using an SG-Si wafer as a base layer, the base layer of oxide tunneling junction solar cell fabricated in FIG. 3 is formed using a layer of epitaxially grown c-Si.

In operation 3A, an SG-Si substrate 300 is prepared using a process similar to that of operation 2A, except that no surface texturing is formed.

In operation 3B, a thin layer of heavily doped c-Si, layer 302, is epitaxially grown on SG-Si substrate 300. In one embodiment, heavily doped c-Si epitaxial (EPI) layer 302 is formed using a chemical-vapor-deposition (CVD) epitaxial process. Various types of Si compounds, such as $SiH_4$, $SiH_2Cl_2$, and $SiHCl_3$, can be used as a precursor in the CVD process to form heavily doped c-Si EPI layer 302. In one embodiment, $SiHCl_3$ (TCS) is used due to its abundance and low cost. The thickness of heavily doped c-Si EPI layer 302 can be between 1 μm and 5 μm. The doping type of heavily doped c-Si EPI layer 302 is the same as the doping type of SG-Si substrate 300. In one embodiment, heavily doped c-Si EPI layer 302 is n-type doped. The doping concentration of heavily doped c-Si EPI layer 302 can be between $1\times10^{17}/cm^3$ and $1\times10^{20}/cm^3$. The doping level should not exceed a maximum limit, which may cause misfit dislocations in the film. Heavily doped c-Si EPI layer 302 can act as a back surface field (BSF), an impurity barrier, and a contaminant getter layer for reducing electron-hole recombination at the surface of the subsequently grown base layer.

In operation 3C, a layer of lightly doped c-Si is epitaxially grown on heavily doped c-Si EPI layer 302 to form a base layer 304. The process used for the growth of base layer 304 is similar to the one used for the growth of heavily doped c-Si EPI layer 302. In one embodiment, a CVD EPI process is used to form base layer 304. The thickness of base layer 304 can be between 20 μm and 100 μm. The doping type of base layer 304 is the same as the doping type of SG-Si substrate 200 and heavily doped c-Si EPI layer 302. In one embodiment, base layer 304 is n-type doped, which can provide better carrier lifetime, higher $V_{oc}$, and higher solar cell efficiency. The doping concentration of base layer 304 can be between $1 \times 10^{15}/cm^3$ and $1 \times 10^{17}/cm^3$.

After EPI growth of base layer 304, in operation 3D, SG-Si substrate 300 and heavily doped c-Si EPI layer 302 are removed. Various techniques can be used to remove SG-Si substrate 300 and heavily doped c-Si EPI layer 302, including, but not limited to: mechanical grinding, chemical wet etching, dry etching, and chemical mechanical polishing. In one embodiment, a mechanical backgrinding method is used to remove SG-Si substrate 300 and heavily doped c-Si EPI layer 302. Subsequently, a wet chemical etching process is used to remove all backgrind damage which may result in increased minority-carrier recombination, thus degrading the solar cell performance. Solutions used in the wet chemical etching include, but are not limited to: sodium hydroxide (NaOH), tetramethylammonium hydroxide (TMAH), and a mixture of nitric acid and hydrofluoric acid ($HNO_3$:HF).

In operation 3E, the front and back surfaces of base layer 304 are textured to maximize light absorption inside the solar cell, thus further enhancing solar cell conversion efficiency. The shapes of the surface texture can be pyramids or inverted pyramids, which are randomly or regularly distributed on the front and back surfaces of base layer 304.

The rest of the fabrication process is similar to the one shown in FIG. 2. In operation 3F, front and back passivation/tunneling layers 306 and 308 are formed using a process similar to operation 2B.

In operation 3G, emitter layer 310 and BSF layer 312 are formed using a process similar to the one used in operations 2C and 2D.

In operation 3H, front and back TCO layers 314 and 316 are formed using a process similar to the one used in operations 2E and 2F.

In operation 3I, front and back electrodes 318 and 320 are formed using a process similar to the one used in operation 2G.

Fabrication Method III

Figure 4:
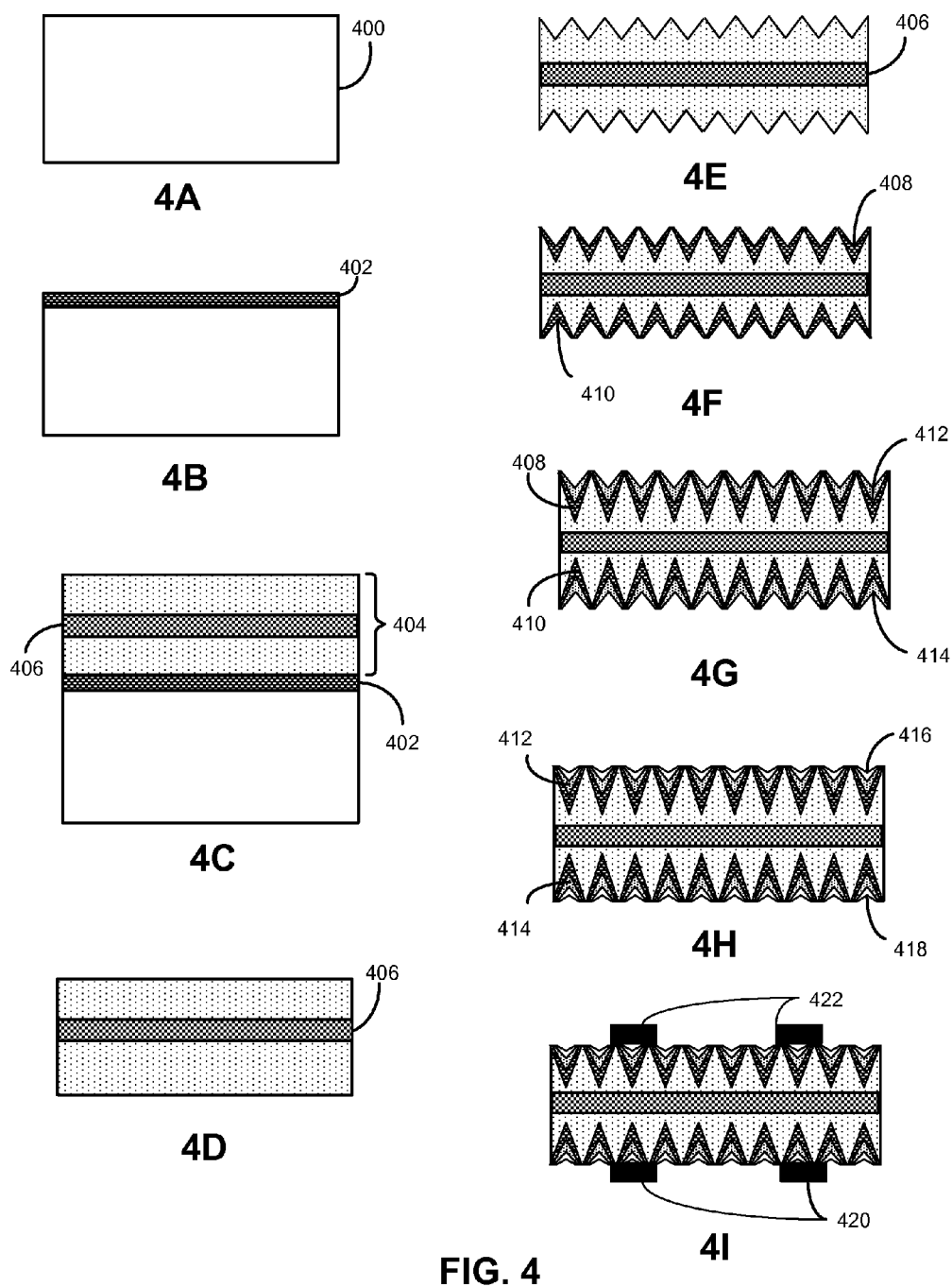
FIG. 4 presents a diagram illustrating the process of fabricating a tunneling junction solar cell in accordance with an embodiment of the present invention.

FIG. 4 presents a diagram illustrating the process of fabricating a tunneling junction solar cell in accordance with an embodiment of the present invention. The fabrication process is similar to the one shown in FIG. 3, except that the epitaxially formed Si base layer now has a graded doping profile.

In operation 4A, an SG-Si substrate 400 is prepared using a process similar to that of operation 3A.

In operation 4B, a thin layer of heavily doped c-Si, layer 402, is epitaxially grown on SG-Si substrate 400 using a process similar to that of operation 3B.

In operation 4C, a layer of c-Si with graded doping is epitaxially grown on heavily doped c-Si EPI layer 402 to form a base layer 404. The doping concentration of base layer 404 is between $1 \times 10^{14}/cm^3$ and $1 \times 10^{18}/cm^3$, with the region adjacent to heavily doped c-Si EPI layer 402 having a higher doping concentration and the opposite side having a lower doping concentration. Such a doping profile results in an electric field that allows the generated minority carriers to drift toward the junction, thus increasing the $J_{sc}$. The thickness of graded-doped base layer 404 can be between 20 μm and 100 μm. In one embodiment, a thin layer of intrinsic EPI c-Si (layer 406) is inserted within graded-doped base layer 404. In one embodiment, intrinsic EPI c-Si layer 406 is placed in the middle of graded-doped base layer 404. The thickness of intrinsic EPI c-Si layer 406 can be between 1 and 10 nm.

The insertion of intrinsic EPI c-Si layer 406 ensures better film quality of graded-doped base layer 404 because it limits defect propagation and lattice mismatch during the EPI growth of base layer 404. Note that intrinsic EPI c-Si layer 406 can be deposited at any point during the growth of graded-doped base layer 404 by changing the gas flow into the epitaxial chamber.

The rest of the fabrication process is similar to the one shown in FIG. 3. In operation 4D, SG-Si substrate 400 and heavily doped c-Si EPI layer 402 are removed using a process similar to operation 3D. In operation 4E, the front and back surfaces of base layer 404 are textured using a process similar to operation 3E. In operation 4F, front and back passivation/tunneling layers 408 and 410 are formed using a process similar to operation 3F. In operation 4G, emitter layer 412 and BSF layer 414 are formed using a process similar to the one used in operation 3G. In operation 4H, front and back TCO layers 416 and 418 are formed using a process similar to the one used in operation 3H. In operation 4I, front and back electrodes 420 and 422 are formed using a process similar to the one used in operation 3I.

Fabrication Method IV

Figure 5:
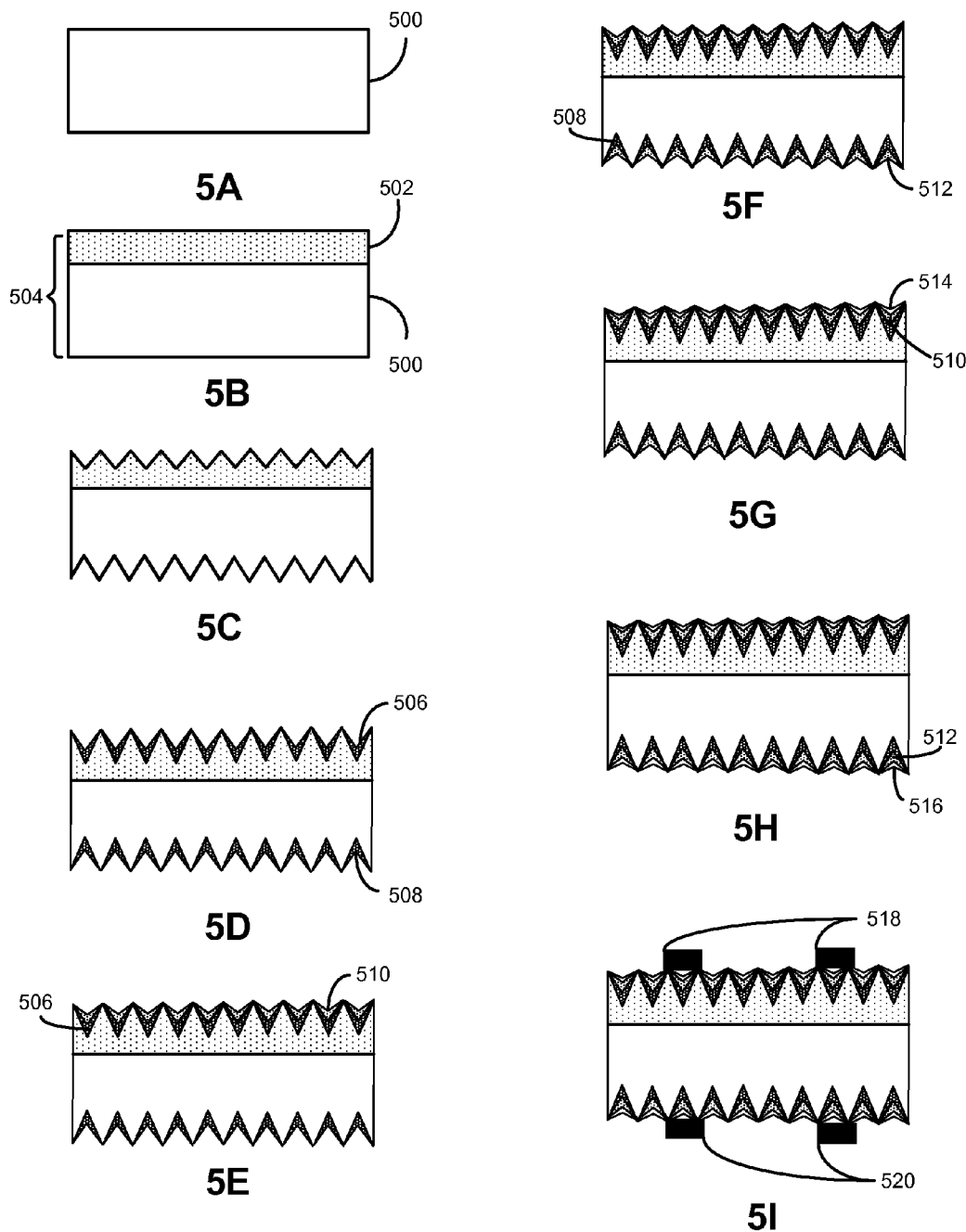
FIG. 5 presents a diagram illustrating the process of fabricating a tunneling junction solar cell in accordance with an embodiment of the present invention.

FIG. 5 presents a diagram illustrating the process of fabricating a tunneling junction solar cell in accordance with an embodiment of the present invention. The fabrication process is similar to the one shown in FIG. 2, except that an epitaxially formed c-Si layer is deposited on the SG-Si substrate to form a composite base.

In operation 5A, an SG-Si substrate 500 is prepared using a process similar to that of operation 2A, except that no surface texturing is formed.

In operation 5B, a thin layer of c-Si is epitaxially grown on SG-Si substrate 500 to form an enhancing layer 502. SG-Si substrate 500 and enhancing layer 502 together form a composite base layer 504. The doping type of enhancing layer 502 is similar to that of SG-Si substrate 500. In one embodiment, enhancing layer 502 is n-type doped. In addition, enhancing layer 502 can either be uniformly doped or graded doped. In one embodiment, enhancing layer 502 is uniformly doped with a uniform sheet resistance of 0.5 ohm-cm. In one embodiment, enhancing layer 502 is graded doped with sheet resistance varying between 0.2 ohm-cm and 1 ohm-cm. The thickness of enhancing layer 502 can be between 0.5 μm and 2 μm. Note that, compared with the solar cells fabricated in FIGS. 3 and 4, the thickness of enhancing layer 502, which is an EPI c-Si layer, is much thinner than EPI base layers 304 and 404, whose thickness can be greater than 20 μm. Such a thin EPI layer can be easily manufactured at a lower cost. By combining SG-Si substrate 500 (which is cheaper and can be used as an absorber layer) and thin EPI enhancing layer 502 (whose characteristics can be carefully engineered during EPI growth) as a composite base layer, we can achieve the goal of lowering manufacture cost and improving performance at the same time.

The rest of the fabrication process is similar to the one shown in FIG. 2. In operation 5C, the front and back surfaces of composite base layer 504 are textured using a process similar to operation 2A. In operation 5D, front and back passivation/tunneling layers 506 and 508 are formed using a process similar to operation 2B. In operation 5E, an emitter layer 510 is deposited on top of front passivation/tunneling layer 506 using a process similar to operation 2C. In operation 5F, a BSF layer 512 is deposited on the surface of back passivation/tunneling layer 508 using a process similar to operation 2D. In operation 5G, a front TCO layer 514 is deposited on top of emitter layer 510 using a process similar to operation 2E. In operation 5H, a back TCO layer 516 is deposited on the surface of BSF layer 512 using a process similar to operation 2F. In operation SI, front and back electrodes 518 and 520 are formed using a process similar to the one used in operation 2G.

Fabrication Method V

Figure 6:
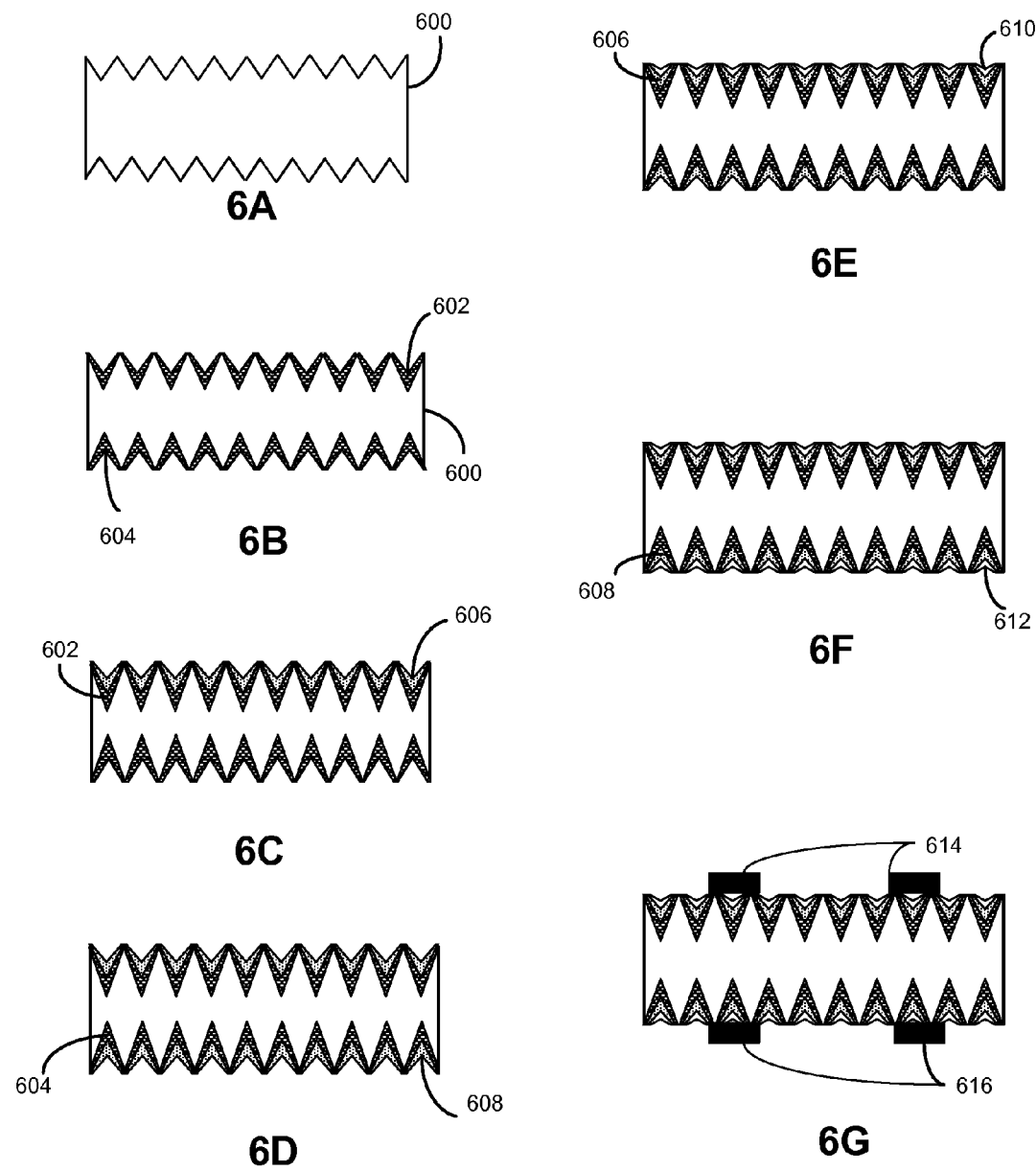
FIG. 6 presents a diagram illustrating the process of fabricating a tunneling junction solar cell in accordance with an embodiment of the present invention.

FIG. 6 presents a diagram illustrating the process of fabricating a tunneling junction solar cell in accordance with an embodiment of the present invention. The fabrication process is similar to the one shown in FIG. 2, except that a emitter layer (which has an opposite doping type as that of the base layer) is formed on the surface of the back tunneling/passivation layer, and a front surface field (FSF) layer (which has a same doping type as that of the base layer) is formed on the surface of the front tunneling/passivation layer.

In operation 6A, an SG-Si substrate 600 is prepared using a process similar to that of operation 2A In operation 6B, front and back passivation/tunneling layers 602 and 604 are formed using a process similar to operation 2B.

In operation 6C, an FSF layer 606 is deposited on the top surface of front passivation/tunneling layer 602 using a process similar to operation 2D. The doping type of FSF layer 606 is the same as that of substrate 600.

In operation 6D, an emitter layer 608 is deposited on the surface of back passivation/tunneling layer 604 using a process similar to operation 2C. The doping type of emitter layer 608 is opposite to that of substrate 600. Note that emitter layer 608 is on the backside of the solar cell, facing away from incident sunlight.

In operation 6E, a front TCO layer 610 is deposited on top of FSF layer 606 using a process similar to operation 2E. In operation 6F, a back TCO layer 612 is deposited on the surface of emitter layer 608 using a process similar to operation 2F. In operation 6G, front and back electrodes 614 and 616 are formed using a process similar to the one used in operation 2G.

Note that the process used in FIG. 6 can also be combined with processes used in FIGS. 3-5 to fabricate solar cells with an emitter on the back side of the solar cell facing away from incident sunlight and an FSF layer on the front side of the solar cell.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for fabricating a tunneling-junction based solar cell, comprising:
    obtaining a base layer for the solar cell, wherein the base layer comprises a top portion, a bottom portion, and a thin layer of intrinsic Si sandwiched between the top portion and a bottom portion, and wherein the intrinsic Si layer's thickness is between 1 nm and 10 nm;
    simultaneously forming a front-side quantum-tunneling-barrier (QTB) layer on a front surface of the base layer and a back-side QTB layer on a back surface of the base layer;
    forming an emitter;
    forming a surface field layer;
    forming a front-side electrode; and
    forming aback-side electrode.

2. The method of claim 1, wherein the base layer comprises at least one of:
    a mono-crystalline silicon wafer; and
    an epitaxially grown crystalline-Si (c-Si) thin film.

3. The method of claim 2, wherein the epitaxially grown c-Si thin film's doping profile is modulated.

4. The method of claim 1, wherein the QTB layers comprise at least one of:
    silicon oxide ($SiO_x$);
    hydrogenated $SiO_x$;
    silicon nitride ($SiN_x$);
    hydrogenated $SiN_x$;
    aluminum oxide ($AlO_x$);
    silicon oxynitride (SiON); and
    hydrogenated SiON.

5. The method of claim 1, wherein the QTB layers have a thickness between 1 and 50 angstroms.

6. The method of claim 1, wherein forming the QTB layers involves at least one of the following techniques:
    thermal oxidation;
    atomic layer deposition;
    wet or steam oxidation;
    low-pressure radical oxidation; and
    plasma-enhanced chemical-vapor deposition (PECVD).

7. The method of claim 1, further comprising forming a transparent conductive oxide (TCO) layer on the emitter, the surface field layer, or both.

8. The method of claim 1, wherein the emitter and the surface field layer comprise amorphous-Si (a-Si).

9. The method of claim 8, wherein the emitter comprises carbon-doped a-Si.

10. The method of claim 8, wherein the emitter and the surface field layer comprise undoped a-Si.

11. The method of claim 8, wherein the emitter and the surface field layer comprise graded-doped amorphous-Si (a-Si).

12. The method of claim 11, wherein the graded-doped a-Si has a doping concentration ranging between $1\times10^{15}$ /$cm^3$ and $5\times10^{20}$ /$cm^3$.

13. The method of claim 11, wherein when an n-type dopant is used for the graded-doped a-Si the n-type dopant comprises phosphorus, and wherein when a p-type dopant is used for the graded-doped a-Si the p-type dopant comprises boron.

14. The method of claim 1, wherein the base layer has a donor (n-type) or acceptor (p-type) doping concentration ranging between $1\times10^{14}$/$cm^3$ and $1\times10^{18}$/$cm^3$.

15. The method of claim 14, wherein the emitter has an opposite doping type as that of the base layer, and wherein the surface field layer has a same doping type as that of the base layer.

16. The method of claim 15, wherein the emitter is formed on the front-side QTB layer, facing incident light, and wherein the surface field layer is formed on the back-side QTB layer to act as a back surface field (BSF).

17. The method of claim 15, wherein the emitter is formed on the back-side QTB layer, facing away from incident light, and wherein the surface field layer is formed on the fornt-side QTB layer to act as a front surface field (FSF).

18. A tunneling-junction based solar cell, comprising:
    a base layer, wherein the base layer comprises a top portion, a bottom portion, and a thin layer of intrinsic Si sandwiched between the top portion and the bottom portion, and wherein the intrinsic Si layer's thickness is between 1 nm and 10 nm;
    a front quantum-tunneling-barrier (QTB) layer situated on a front surface of the base layer;

a back QTB layer situated on a back surface of the base layer;
an emitter;
a surface field layer;
a front-side electrode; and
a back-side electrode.

19. The solar cell of claim 18 wherein the base layer comprises at least one of:
a mono-crystalline silicon wafer; and
an epitaxially grown crystalline-Si (c-Si) thin film.

20. The solar cell of claim 19, wherein the epitaxially grown c-Si thin film's doping profile is modulated.

21. The solar cell of claim 18, wherein the QTB layers comprise at least one of:
silicon oxide ($SiO_x$);
hydrogenated $SiO_x$;
silicon nitride ($SiN_x$);
hydrogenated $SiN_x$;
aluminum oxide ($AlO_x$);
silicon oxynitride (SiON); and
hydrogenated SiON.

22. The solar cell of claim 18, wherein the QTB layers have a thickness between 1 and 50 angstroms.

23. The solar cell of claim 18, wherein the QTB layers are formed using at least one of the following techniques:
thermal oxidation;
atomic layer deposition;
wet or steam oxidation;
low-pressure radical oxidation; and
plasma-enhanced chemical-vapor deposition (PECVD).

24. The solar cell of claim 18, further comprising a transparent conductive oxide (TCO) layer situated on top of the emitter, the surface field layer, or both.

25. The solar cell of claim 18, wherein the emitter and the surface field layer comprise amorphous-Si (a-Si).

26. The solar cell of claim 25, wherein the emitter comprises carbon-doped a-Si.

27. The solar cell of claim 25, wherein the emitter and the surface field layer comprise undoped a-Si.

28. The solar cell of claim 25, wherein the emitter and the surface field layer comprise graded-doped amorphous-Si (a-Si).

29. The solar cell of claim 28, wherein the graded-doped a-Si has a doping concentration ranging between $1\times10^{15}/cm^3$ and $5\times10^{20}/cm^3$.

30. The solar cell of claim 28, wherein when an n-type dopant is used for the graded-doped a-Si the n-type dopant comprises phosphorus, and wherein when a p-type dopant is used for the graded-doped a-Si the p-type dopant comprises boron.

31. The solar cell of claim 18, wherein the base layer has a donor (n-type) or acceptor (p-type) doping concentration ranging between $1\times10^{14}/cm^3$ and $1\times10^{18}/cm^3$.

32. The solar cell of claim 31, wherein the emitter has an opposite doping type as that of the base layer, and wherein the surface field layer has a same doping type as that of the base layer.

33. The solar cell of claim 32, wherein the emitter is situated above the base layer facing incident light, and wherein the surface field layer is situated beneath the base layer to act as a back surface field (BSF).

34. The solar cell of claim 32, wherein the emitter is situated beneath the base layer facing away from incident light, and wherein the surface field layer is situated above the base layer to act as a front surface field (FSF).

35. The method of claim 1, wherein forming the QTB layers involves using a wet oxidation technique to form a $SiO_x$, layer with x less than 2.

36. The solar cell of claim 18, wherein the QTB layers comprise a $SiO_x$, layer with x less than 2, wherein the $SiO_x$, layer is formed using a wet oxidation technique.

37. A solar cell, comprising:
a base layer, wherein the base layer comprises a top portion, a bottom portion, and a thin layer of intrinsic Si sandwiched between the top portion and the bottom portion, and wherein the intrinsic Si layer's thickness is between 1 nm and 10 nm;
a quantum-tunneling-barrier (QTB) layer situated adjacent to the base layer, wherein the QTB layer comprises $SiO_x$, with x less than two;
an emitter;
a surface field layer;
a front-side electrode; and
a back-side electrode.

* * * * *